United States Patent [19]

Miccoli et al.

[11] 4,412,311

[45] Oct. 25, 1983

[54] STORAGE CELL FOR NONVOLATILE ELECTRICALLY ALTERABLE MEMORY

[75] Inventors: Franco Miccoli, Ravenna; Giuseppe Corda, Saronno, both of Italy

[73] Assignee: SGS-Ates Componenti Elettronici S.p.A., Agrate Briazna, Italy

[21] Appl. No.: 269,814

[22] Filed: Jun. 3, 1981

[30] Foreign Application Priority Data

Jun. 4, 1980 [IT] Italy ............................. 22538 A/80

[51] Int. Cl.³ .......................................... G11C 11/40
[52] U.S. Cl. .................................................. 365/185
[58] Field of Search ........................................ 365/185

[56] References Cited

U.S. PATENT DOCUMENTS

| | | | |
|---|---|---|---|
| 4,087,795 | 5/1978 | Rossler | 365/185 |
| 4,132,904 | 1/1979 | Harari | 365/185 |
| 4,257,056 | 3/1981 | Shum | 365/185 |
| 4,300,212 | 11/1981 | Simko | 365/185 |

FOREIGN PATENT DOCUMENTS

| | | | |
|---|---|---|---|
| 2931031 | 2/1980 | Fed. Rep. of Germany | 365/185 |
| 55-52592 | 4/1980 | Japan | 365/185 |
| 2073488 | 10/1981 | United Kingdom | 365/185 |

OTHER PUBLICATIONS

IEEE Journal of Solid-State Circuits, vol. SC-14, No. 2, Apr. 1979, pp. 498-508, An Electrically Alterable, Nonvolatile Memory Cell Using a Floating-Gate Structure, Guterman et al.

IBM Technical Disclosure Bulletin, vol. 23, No. 1, Jun. 1980, pp. 227-228, Double Polysilicon Electrically Alterable Read-Only Structure Cell, Hsieh et al.

*Primary Examiner*—George G. Stellar
*Attorney, Agent, or Firm*—Karl F. Ross

[57] ABSTRACT

A storage cell of a nonvolatile electrically alterable MOS memory (EAROM) comprises a p-type silicon substrate with n-doped drain and source areas interlinked by an n-channel which is partly overlain by a floating gate extending over part of the drain area. An accessible gate overlaps the floating gate and has an extension overlying a gap between the latter gate and the source area to act as a common control electrode for two series IGFETs defined by the source and gate areas, namely a main or storage transistor and an ancillary or switching transistor. The capacitance of the floating gate relative to the drain area accounts for about half the overall capacitance of that gate relative to the entire semiconductor structure.

7 Claims, 5 Drawing Figures

STORAGE CELL FOR NONVOLATILE ELECTRICALLY ALTERABLE MEMORY

FIELD OF THE INVENTION

Our present invention relates to a storage cell for a nonvolatile read-only memory of the electrically alterable kind (EAROM) comprising two insulated-gate field-effect transistors (IGFETs) in series, one of them having a so-called floating gate to serve as a main or storage transistor while the other acts as an ancillary or switching transistor.

BACKGROUND OF THE INVENTION

A memory consisting essentially of an orthogonal array of such storage cells is known, for example, from U.S. Pat. No. 4,122,544 to David J. McElroy. The two IGFETs of each cell are formed in semiconductor substrate of p-type conductivity, specifically a silicon chip, provided on its surface with n-doped source and drain areas separated by a channel region. A dielectric layer of thermally grown silicon oxide overlies that surface and spans its channel region as well as an adjacent part of the source area. An inaccessible or "floating" gate of phosphorus-doped polycrystalline silicon is embedded in this oxide layer and overlies part of the channel region while being in turn overlain by an accessible control gate of like material extending over the full width of the oxide layer. This accessible gate serves as a common control electrode for the two series-connected transistors referred to above, i.e. the main transistor whose channel underlies the floating gate and the ancillary transistor essentially located in the gap between the floating gate and the drain area.

A writing operation, designed to store a logical "1" in the main transistor, involves the application of a high positive potential (+25 V) to the drain area and to the control gate. This generates an electric field across the oxide film which underlies the floating gate whereby high-speed electrons traversing the channel are attracted into the floating gate. The resulting negative charge of the floating gate prevents the main transistor from conducting when predetermined lower reading voltages on the order of 5 V are applied to the control gate and the drain area; to cancel the stored "1", the control gate is again biased highly positive while the drain voltage is kept low, thereby enabling the extraction of the electronic charge from the floating gate via the oxide film separating the two gates from each other.

It is also known, e.g. from U.S. Pat. No. 3,825,946, to provide two accessible gates in addition to a floating gate for writing and for cancellation or erasure, respectively.

Experience has shown that the time of application of the gate-biasing potential required for cancellation—i.e. for lowering the conduction threshold of the main transistor to a predetermined level—progressively increases with the number of reprogramming operations, presumably on account of a reduced electron permeability of the oxide layer due to the trapping of electrons therein. To a lesser extent this is also true of the time of application of the gate-biasing potential required for the writing of a cell, i.e. for the raising of its conduction threshold to a predetermined elevated level. This phenomenon of aging limits the number of times a given cell can be reprogrammed before excessive time or voltage requirements render it practically unusable.

Certain measures for increasing the possible number of reprogramming operations in such a memory have been disclosed in commonly owned U.S. applications Ser. No. 168,561 (now U.S. Pat. No. 4,357,685) and 168,562 (now abandoned) filed July 14, 1980 by Vincenzo Daniele et al.

OBJECT OF THE INVENTION

The object of our present invention is to provide an improved memory cell of the character referred to which, besides having a very compact structure, can be programmed or written and deprogrammed or erased at relatively low voltages whereby, on the one hand, such a memory will be compatible with systems operating at voltages of about 15 to 20 V and, on the other hand, the aging phenomenon described above will be slowed.

SUMMARY OF THE INVENTION

We have found, in accordance with our present invention, that this object can be attained by letting the floating gate overlie a portion of the drain area adjoining the channel region while limiting the control gate to the zone between the drain and source areas whereby the control gate only overlaps the floating gate without fully overlying same.

The close juxtaposition of the floating gate with a substantial part of the drain area provides a significant capacitive coupling therebetween with the result that, as more fully described hereinafter, the electronic loading of the gate in a writing phase is determined primarily by the drain voltage and largely independent of the control-gate voltage. The control gate can therefore be shaped for optimum efficiency in the cancellation phase in which it plays a dominant role.

More particularly, we prefer to choose the dimensions and relative positions of the two gates in such a way that the capacitance of the floating gate relative to the drain area approximately equals half the overall capacitance of that gate, i.e. its capacitance relative to the entire semiconductor structure.

BRIEF DESCRIPTION OF THE DRAWING

The above and other features of our present invention will now be described in detail with reference to the accompanying drawing in which.

SPECIFIC DESCRIPTION

Figure 1B:
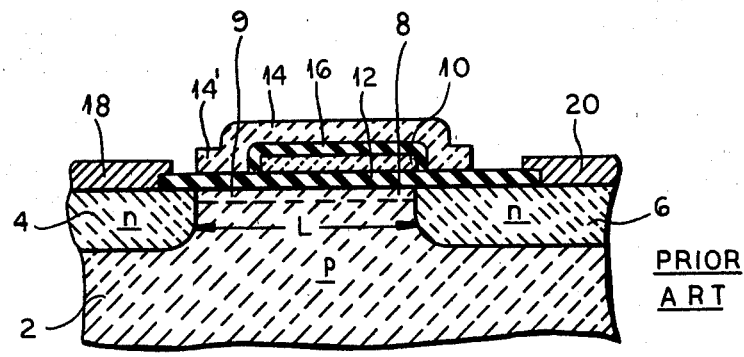
FIG. 1B is a cross-sectional view taken on the line IB—IB of FIG. 1.
Figure 1A:
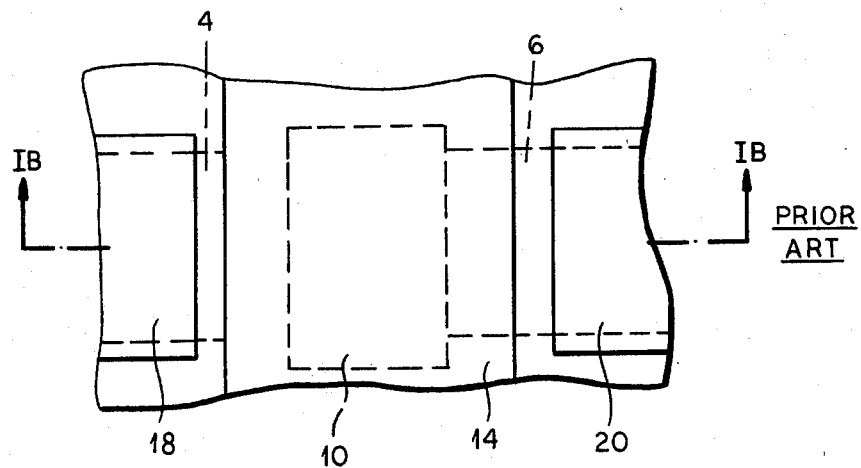
FIG. 1A is a fragmentary plan view of a semiconductor structure forming a conventional memory cell of the type described in U.S. Pat. No. 4,122,544.

The conventional memory cell shown in FIGS. 1A and 1B comprises a silicon substrate 2 of p-type conductivity with two n-doped enclaves 4 and 6 near its upper surface. These enclaves are separated by a channel region 8 of length L equaling about 9µ. A layer of silicon oxide, spanning the channel region 8 an adjacent parts of areas 4 and 6, forms a lower stratum or film 12 and an upper stratum or film 16 bracketing a floating gate 10 which is fully embedded in that layer and is therefore inaccessible. This oxide layer is overlain by a control gate 14 which, like gate 10, consists of n-type polycrystalline silicon with phosphorus doping. Gate 14 projects on both sides beyond the uppe oxide film 16 enveloping the floating gate 10. Thus, an extension 14' of gate 14 overlies a gap 9 of channel region 8 not covered by gate 10 and acts as a control electrode for a switching transistor in series with a main transistor; the latter is defined by the major part of the channel region 8, i.e. by the part thereof lying underneath the floating gate. Areas 4 and 6 carry respective metal contacts 18 and 20 which in accordance with the teaching of McElroy U.S. Pat. No. 4,122,544 constitute a drain and a source electrode, respectively. Each oxide film 12 and 16 has a thickness of about 1,000 Å.

In operation, the source electrode 20 is generally maintained at the substrate voltage or ground level $V_{ss}$. For writing, as described in the McElroy patent, control gate 14 and drain 18 are taken to a potential of +25 V whereby gate 10 is charged with electrons subsequently acting as a shield between channel 8 and control gate 14. On account of this shielding effect, therefore, the cell will not conduct when a lower reading voltage of roughly 5 V is applied to gate 14 and drain 18; this is conventionally considered as the storage of a logical "1". For cancellation, i.e. the storage of a logical "0", gate 14 is taken to the same high voltage as before while drain 18 is held at voltage $V_{ss}$; the resulting extraction of electrons from gate 10 via oxide film 16 lowers the threshold of the control voltage which will enable the cell to conduct.

In principle, the roles of enclaves 4 and 6 can also be reversed with electrode 18 acting as the grounded source and electrode 20 serving as the drain.

As will be apparent from FIG. 1A, gate 14 is a strip which extends transversely to channel 8 and may be common to a multiplicity of storage cells forming part of a memory row as shown in the McElroy patent. Floating gate 10, on the other hand, is confined to the cell here considered and has a width substantially smaller than the channel length L.

Figure 2B:
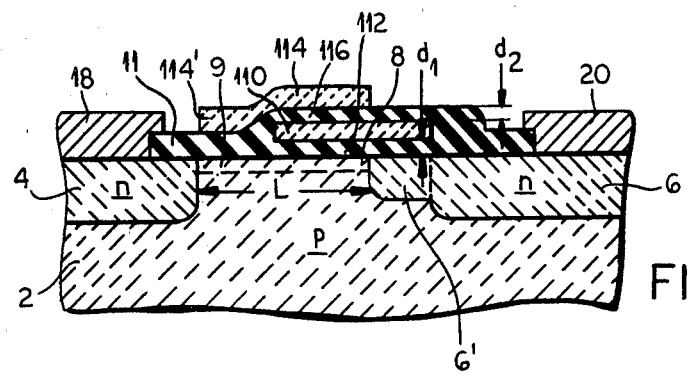
FIG. 2B is a cross-sectional view taken on the line IIB—IIB of FIG. 2A.
Figure 2A:
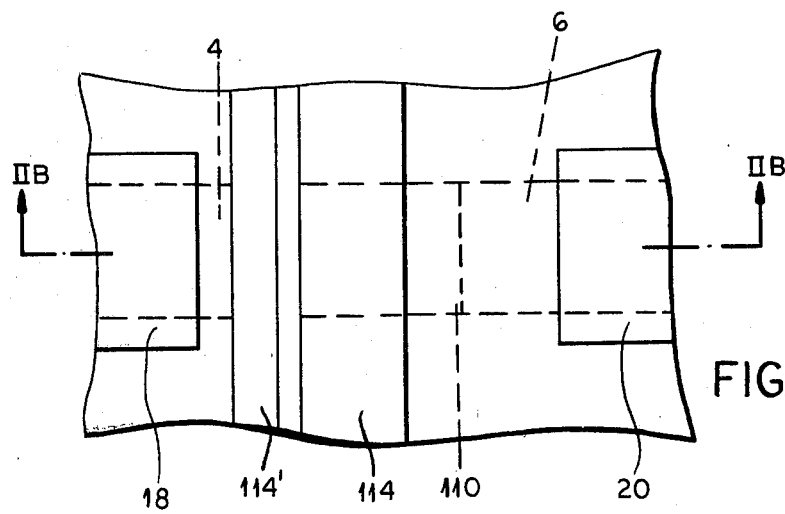
FIG. 2A is a view similar to FIG. 1A but illustrating our present improvement.

In accordance with our present invention, and as illustrated in FIGS. 2A and 2B, we provide a similar substrate 2 of p-type monocrystalline silicon with two n-type enclaves 4 and 6 respectively consituting a source region and a drain region overlain by electrodes 18 and 20. Here, however, drain area 6 has been extended toward source area 4 by a zone 6' so that the length L of the intervening channel region 8 is reduced to about 5µ. A floating gate 110 of n-type polycrystalling silicon, embedded in a dielectric layer of silicon oxide, overlies the channel 8 of the main IGFET as well as the extension 6' of drain area 6. A control gate 114, whose width equals the channel length L and approximately corresponds to the extent of floating gate 110 in the channel direction, overlaps about half of the latter gate and lies entirely between the confronting edges of source area 4 and drain area 6, 6', thus terminating above the boundaries of these areas. Films 112 and 116, forming part of the oxide layer, separate the gate 110 from silicon chip 2 and gate 114, respectively, and may have respective thicknesses $d_1$ and $d_2$ between about 600 and 1,000 Å. A nonoverlapping extension 114' of gate 114, constituting the control elements of the ancillary IGFET defined by the gap 9, is separated from the substrate 2 by a somewhat heavier portion 11 of the oxide layer.

Figure 3:
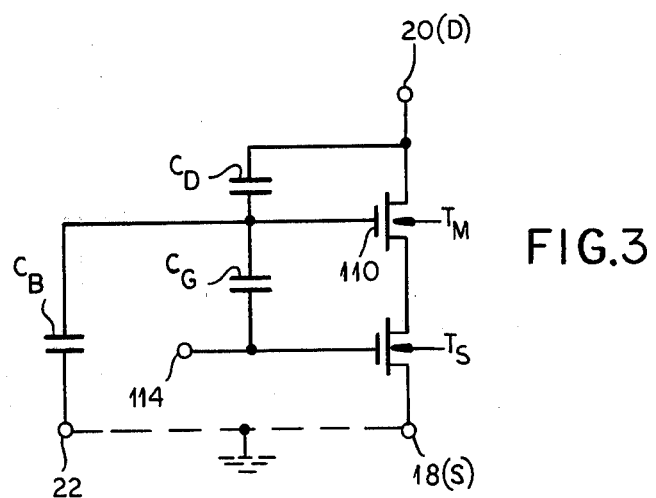
FIG. 3 is an equivalent-circuit diagram of the memory cell shown in FIGS. 2A and 2B.

In FIG. 3, which represents the equivalent circuit of the structure shown in FIGS. 2A and 2B, we have shown at $T_S$ and $T_M$ the ancillary switching transistor and the main storage transistor controlled by the common gate 114. Terminals 18 and 20 represent the correspondingly designated source and drain electrodes of FIGS. 2A and 2B; another terminal 22, grounded like electrode 18, is an otherwise nonillustrated counterelectrode disposed on the underside of substrate 2. At $C_B$, $C_G$ and $C_D$ we have indicated the capacitances of floating gate 110 relative to substrate 2, control gate 114 and drain area 6, 6', respectively; the sum of these capacitances constitutes the overall floating-gate capacitance $C_T = C_B + C_D + C_G$.

In a writing phase a field $E_w$ developed across film 112 (FIG. 2B) draws electrons from channel 8 into the floating gate 110, these electrons being accelerated by the voltage difference between the source and the drain so as to acquire enough potential energy to overcome the potential barrier of the intervening oxide layer. The field $E_w$ is given by $$E_w = (V_F - V_{CH})/d_1 \qquad (1)$$

where $V_F$ is the potential of gate 110 and $V_{CH}$ is the potential of channel 8. The latter potential varies along the length L of the channel, reaching its maximum at the drain area 6, 6'. The gate potential $V_F$ is given by $$V_F = (C_G \cdot V_G + C_D \cdot V_D + Q_F)/C_T \qquad (2)$$

where $Q_F$ is the charge of floating gate 110 while $V_G$ and $V_D$ are, respectively, the potentials of control gate 114 and drain 20 relative to source 18. The transfer of electrons from channel 8 to gate 110 can, of course, occur only at that portion of the channel where $V_F > V_{CH}$, i.e. where the field $E_w$ is positive; this channel portion may be referred to as a write-enabling section. In the neutral of uncharged state of gate 110 the value of $Q_F$ will be zero.

With the drain-area extension 6' and the foreshortening of floating gate 114, as well as by suitable choice of film thicknesses $d_1$ and $d_2$, it is easy to make the ratio $C_D/C_T$ equal to approximately 1:2, with $C_D$ preferably lying in a range of 45% to 55% of $C_T$ compared with a range of 10% to 20% in a conventional system such as that shown in FIGS. 1A and 1B (with enclave 6 operated as the drain area). The floating-gate voltage $V_F$ will then be mainly determined by the drain voltage $V_D$ which, during writing, must be high in any event in order to impart the necessary potential energy to the electrons in channel 8. The contribution from control-gate voltage $V_G$, even though relatively small, helps extend the effective length of the write-enabling channel section. By reducing the surface resistivity of the channel region 8 relative to that of conventional cells of this kind, e.g. by increasing the surface concentration by ion implantation of p-type impurities into the channel region 8 so as to double or triple its usual surface concentration, we can increase the number of high-energy electrons and thus operate with a relatively low drain voltage in the writing phase.

In the cancellation phase, a field $E_c$ developed across oxide film 116 is given by $$E_c = (V_G - V_F)/d_2 \qquad (3)$$

which according to equation (2), with $V_D = 0$, can be written $$E_c = [V_G(1 - (C_G/C_T) - (Q_F/C_T)]/d_2 \quad (4)$$

As will be apparent from this equation, the cancellation field $E_c$ increases under otherwise unchanged conditions with decreasing values of the inter-gate capacitance $C_G$. Since, as noted above, this capacitance $C_G$ has little effect upon the writing field $E_w$, its value can be rather small in order to allow the contents of the cell to be erased with a relatively low control voltage $V_G$. Since the difference $\Delta V_t$ between the conduction thresholds of the written and the nonwritten cell is equal to $Q_F/C_G$, the small value of capacitance $C_G$ enables that difference $\Delta V_T$ to be maintained at the usual minimum value of 4 to 5 V with a relatively low charge $Q_F$. Thus, our improved memory cell can be reprogrammed a greater number of times than a conventional cell, because the charge flow through the oxide films is reduced both in ther writing and in the cancellation phase so that the oxide deterioration is slowed.

The channel surface resistivity in this cell can be adjusted to operate the cell with a relatively high conduction threshold to store a logical "1" when the gate 110 is substantially uncharged, a logical "0" being stored by a positive gate charge resulting from the extraction of electrons in the cancellation phase. We have found that a suitable channel resistivity for a cell having the size and the oxide-film thicknesses given above is obtained by a surface impurity concentration ranging between 4 and $6 \cdot 10^{18}/cm^3$.

The manufacture of the cell shown in FIG. 2A and 2B is largely conventional and entirely compatible with the simultaneous formation of other integrated components in the same substrate. Whereas, however, the doping of enclave 6 in the prior art structure of FIGS. 1A and 1B is generally carried out with gate 10 serving as a mask, the extension 6' of drain area 6 shown in FIG. 2B is achieved by the implantation of n-type impurities through films 116 and 112 as well as gate 110 with gate 114 used for masking purposes. This insures a precise alignment of the right-hand boundary of gate 114 with the corresponding channel edge.

It will be apparent that the dielectric layer 112, 116 need not necessarily consist of silicon oxide, that control gate 114 could be metallic and that other modifications, e.g. regarding layer thickness and channel length, can be made as long as the basic relationships herein disclosed are maintained.

We claim:

1. A storage cell for a nonvolatile electrically alterable memory, comprising:
   a semiconductor substrate of p-type conductivity provided at a surface thereof with n-doped source and drain areas sepaarated by a channel region;
   a dielectric layer on said surface spanning said channel region and adjacent parts of said source and drain areas;
   a floating gate of conductive material imbedded in said dielectric layer above a portion of said drain area and an adjacent section of said channel region, said floating gate leaving uncovered another section of said channel region adjoining said source area;
   a control gate of conductive material on said dielectric layer extending above and not beyond said channel region between said source and drain areas while terminating above the boundaries of said areas and overlapping only a portion of said floating gate; and
   circuit means connected to said drain area and to said control gate for enabling the application of selected writing, reading and cancellation voltages thereto.

2. A storage cell as defined in claim 1 wherein said substrate consists of monocrystalline silicon, said floating and control gates consist of polycrystalline silicon of n-type conductivity, and said dielectric layer consists of silicon dioxide.

3. A storage cell as defined in claim 2 wherein said dielectric layer has a thickness on the order of 1000 Å between said substrate and said floating gate and between said floating and control gates.

4. A storage cell as defined in claim 1, 2 or 3 wherein said control gate overlies about half of said floating gate.

5. A storage cell as defined in claim 1, 2 or 3 wherein the relative dimensions and positions of said gates provide a capacitance of said floating gate relative to said drain area equaling approximately half the overall capacitance of said floating gate.

6. A storage cell as defined in claim 4 wherein said channel region has a surface impurity concentration ranging between 4 and $6 \cdot 10^{16}/cm^3$.

7. A storage cell as defined in claim 5 wherein said channel region has a surface impurity concentration ranging between 4 and $6 \cdot 10^{16}/cm^3$.

* * * * *